United States Patent [19]
Koshikawa

[11] Patent Number: 6,128,247
[45] Date of Patent: Oct. 3, 2000

[54] SEMICONDUCTOR MEMORY DEVICE FOR MAKING COLUMN DECODER OPERABLE ACCORDING TO RAS ACCESS TIME

[75] Inventor: Yasuji Koshikawa, Tokyo, Japan

[73] Assignee: NEC Corporation, Tokyo, Japan

[21] Appl. No.: 09/474,209

[22] Filed: Dec. 29, 1999

[30] Foreign Application Priority Data

Jan. 29, 1999 [JP] Japan .................................. 11-023289

[51] Int. Cl.⁷ ..................................................... G11C 8/00
[52] U.S. Cl. ...................................... 365/230.06; 365/193
[58] Field of Search .............................. 365/230.06, 193, 365/233.5

[56] References Cited

U.S. PATENT DOCUMENTS 5,642,326  6/1997  Sakurai et al. .......................... 365/193
5,745,429  4/1998  Cowles et al. ...................... 365/230.08
5,812,492  9/1998  Yamauchi et al. ....................... 365/193

*Primary Examiner*—Son T. Dinh
*Attorney, Agent, or Firm*—Young & Thompson

[57] ABSTRACT

A semiconductor memory device is disclosed, in which the output timing of an operation enabling signal for activating the column decoder can be suitably determined according to the RAS access time. The semiconductor memory device comprises a memory cell array; a row decoder for decoding row address data for designating a word line; a column decoder for decoding column address data for designating a data line; and a column decoder control section for outputting an operation enabling signal for making the column decoder operable to the column decoder. The column decoder control section determines the output timing of the operation enabling signal according to a determination of whether a sufficient RAS access time is obtained.

7 Claims, 8 Drawing Sheets

SEMICONDUCTOR MEMORY DEVICE FOR MAKING COLUMN DECODER OPERABLE ACCORDING TO RAS ACCESS TIME

BACKGROUND OF THE INVENTION

1. Field of the Invention

The present invention relates to a semiconductor memory device, in particular, to a structure for controlling the start timing of the operation of the column decoder in a semiconductor memory device such as a DRAM (dynamic random access memory).

This application is based on Patent Application No. Hei 11-23289 filed in Japan, the contents of which are incorporated herein by reference.

2. Description of the Related Art

When data is read out from a conventional semiconductor memory device such as a DRAM, a sense amplifier operation complete signal indicating the completion of the operation of the sense amplifier is used as a signal for enabling the column decoder for decoding the column address which indicates the data line to which a target memory cell (to be read out) is connected.

FIG. 8 is an operational timing chart for reading out data in the DRAM. This timing chart shows the timing of synchronization clock signals RAS (row address strobe) and CAS (column address strobe), address data, and the data output "D out". In the figure, the period $t_{RCD}$ indicates a delay time between the synchronization clock signals RAS and CAS, which corresponds to a period from the time when the signal RAS is output to the time when the signal CAS is output. Here, the synchronization clock signal RAS functions as a control signal for determining the timing for confirming the row address data which designates the word line to which the target memory cell is connected, while the synchronization clock signal CAS functions as a control signal for determining the timing for confirming the column address data. The period $t_{CAC}$ is the CAS access time indicating the period from the time when the synchronization clock signal CAS is output (and the column address is confirmed) to the time when the data is output.

The period $t_{RAC}$ is the RAS access time indicating the period from the time when the above synchronization clock signal RAS falls to the time when the data is output from the target memory cell. This RAS access time corresponds to the total time of the above delay time $t_{RCD}$ (between the outputs of RAS and CAS) and the above CAS access time $t_{CAC}$.

In addition, period $t_{RAS}$ indicates the RAS active time, period $t_{RCS}$ indicates the read command set-up time, and period $t_{RAD}$ indicates the RAS to column address delay time.

In a conventional semiconductor memory device, the column decoder is made operable after the sense amplifier operation complete signal is output. That is, in the conventional technique, a semiconductor memory device having a long RAS access time $t_{RAC}$ is controlled to have a long period from the output of the synchronization clock signal RAS to the time when the column decoder becomes operable, so as to have a suitable RAS-CAS delay time $t_{RCD}$.

However, in such a conventional semiconductor memory device, the column decoder is always made operable after the sense amplifier operation complete signal is output, regardless of the RAS access time $t_{RAC}$; thus, the time $t_{RAC}$ is limited by the time for waiting for the sense amplifier operation complete signal.

That is, as shown in FIG. 7, the electric potential of the word line (to which the target memory cell is connected) rises at time $t_1$, when the row address is confirmed, and the sense enable signal SE for making the sense amplifier operable is output to the sense amplifier at time $t_2$. As a result, the "data" voltage (corresponding to data 1 or 0) applied to a capacitor in the memory cell is amplified, and a "signal" voltage corresponding to the data voltage is superimposed on the pre-charge voltage and appears in a pair of data (or bit) lines.

The completion timing of the amplifying operation of the sense amplifier has dispersion $\Delta t$ according to differences of the manufacturing conditions of each product (i.e., semiconductor memory device); thus, it is necessary to consider a margin $\Delta tm$ with respect to the sense amplifier operation complete signal SEEND.

In addition, this sense amplifier operation complete signal SEEND is generated by delaying the synchronization clock signal RAS by a predetermined time, where this delay time may disperse so that a much longer margin may be necessary. Therefore, the RAS access time $t_{RAC}$ is also limited by the margin $\Delta tm$.

SUMMARY OF THE INVENTION

In consideration of the above circumstances, an objective of the present invention is to provide a semiconductor memory device in which the output timing of an operation enabling signal for activating the column decoder can be suitably determined according to the RAS access time $t_{RAC}$.

Therefore, the present invention provides a semiconductor memory device comprising:

a memory cell array including a plurality of memory cells, each memory cell being connected to a word line and a data line so as to write or read data;

a row decoder for decoding row address data for designating a word line so as to write or read data to or from a target memory cell, connected to the designated word line, in the memory cell array;

a column decoder for decoding column address data for designating a data line so as to select the data line to which the target memory cell is connected;

a sense amplifier for amplifying a signal which transmits the data read out from the target memory cell; and a column decoder control section for outputting an operation enabling signal for making the column decoder operable to the column decoder, and wherein when the data is read out, the column decoder control section determines the output timing of the operation enabling signal according to a determination of whether a sufficient RAS (row address strobe) access time is obtained, where the RAS access time is the period from the falling time of the RAS, a control signal for determining the timing of confirming the row address data, to the time when the data is output from the target memory cell.

According to the above structure, the timing for making the column decoder operable can be suitably determined according to the RAS access time.

Typically, when the data is read out, the column decoder control section determines said output timing based on at least a sense amplifier operation complete signal which indicates the completion of the amplifying operation of the sense amplifier and an identification signal which indicates that a sufficient RAS access time is obtained, in a manner such that:

if a sufficient RAS access time is not obtained, the output timing of the sense amplifier operation complete signal is employed as the output timing of the operation enabling signal, while if a sufficient RAS access time is obtained, the output timing of the sense amplifier operation complete signal is delayed by a predetermined time, and the delayed timing is employed as the output timing of the operation enabling signal.

The column decoder control section may comprise:

a first logical product calculating section for calculating and outputting a logical product between a signal obtained by delaying the sense amplifier operation complete signal by a predetermined time and the identification signal; and a second logical product calculating section for calculating and outputting a logical product between the sense amplifier operation complete signal and the output from the first logical product calculating section, and wherein when the identification signal is input into the first logical product calculating section, the second logical product calculating section outputs the sense amplifier operation complete signal delayed by the predetermined time.

Accordingly, when a sufficient RAS access time can be obtained, the column decoder can be made operable with a sufficient margin with respect to the output timing of the sense amplifier operation complete signal. In contrast, when a sufficient RAS access time cannot be obtained, that is, when it is desirable to operate the column decoder with a high speed, the column decoder can be made operable when the sense amplifier operation complete signal is output.

The present invention also provides a semiconductor memory device having a similar basic structure, wherein when the data is read out, the column decoder control section determines whether the operation enabling signal is output after a sense amplifier operation complete signal which indicates the completion of the amplifying operation of the sense amplifier is output, according to a RAS (row address strobe) access time which is the period from the falling time of the RAS, a control signal for determining the timing of confirming the row address data, to the time when the data is output from the target memory cell.

The column decoder control section may comprise:

a first logical product calculating section for calculating and outputting a logical product between the sense amplifier operation complete signal and an identification signal which indicates that a sufficient RAS access time is obtained; and a second logical product calculating section for calculating and outputting a logical product between the output from the first logical product calculating section and the CAS (column address strobe) which is a control signal for confirming the row address data or a signal equivalent to the CAS, and wherein while the identification signal is not input into the first logical product calculating section, the second logical product calculating section outputs the CAS or the signal equivalent to the CAS as the operation enabling signal; and when the identification signal is input into the first logical product calculating section, the second logical product calculating section outputs a signal corresponding to the logical product between the sense amplifier operation complete signal and the CAS or the signal equivalent to the CAS, as the operation enabling signal.

Accordingly, when a sufficient RAS access time can be obtained, the column decoder can be made operable after the sense amplifier operation complete signal is output. In contrast, when a sufficient RAS access time cannot be obtained, the column decoder can be made operable before the sense amplifier operation complete signal is output, for example, when the CAS or a signal equivalent thereto is output.

The present invention also provides a semiconductor memory device comprising:

a memory cell array including a plurality of memory cells, each memory cell being connected to a word line and a data line so as to write or read data;

a row decoder for decoding row address data for designating a word line so as to write or read data to or from a target memory cell, connected to the designated word line, in the memory cell array;

a column decoder for decoding column address data for designating a data line so as to select the data line to which the target memory cell is connected;

a sense amplifier for amplifying a signal which transmits the data read out from the target memory cell; and a timing adjusting section for determining the input timing of the column address data supplied to the column decoder, according to a RAS (row address strobe) access time which is the period from the falling time of the RAS, a control signal for determining the timing of confirming the row address data, to the time when the data is output from the target memory cell.

The timing adjusting section may comprise:

a delay circuit for delaying the input timing of the column address data;

a signal transmission line for directly transmitting the column address data; and a switching section for selectively inputting the column address data via the delay circuit or the signal transmission line into the column decoder, according to the RAS access time.

Accordingly, the timing for making the column decoder operable can be suitably determined according to the RAS access time also in this case.

DESCRIPTION OF THE PREFERRED EMBODIMENTS

Hereinafter, embodiments of the present invention will be explained with reference to the drawings. In the following embodiments, the semiconductor memory device is a DRAM.

Figure 1:
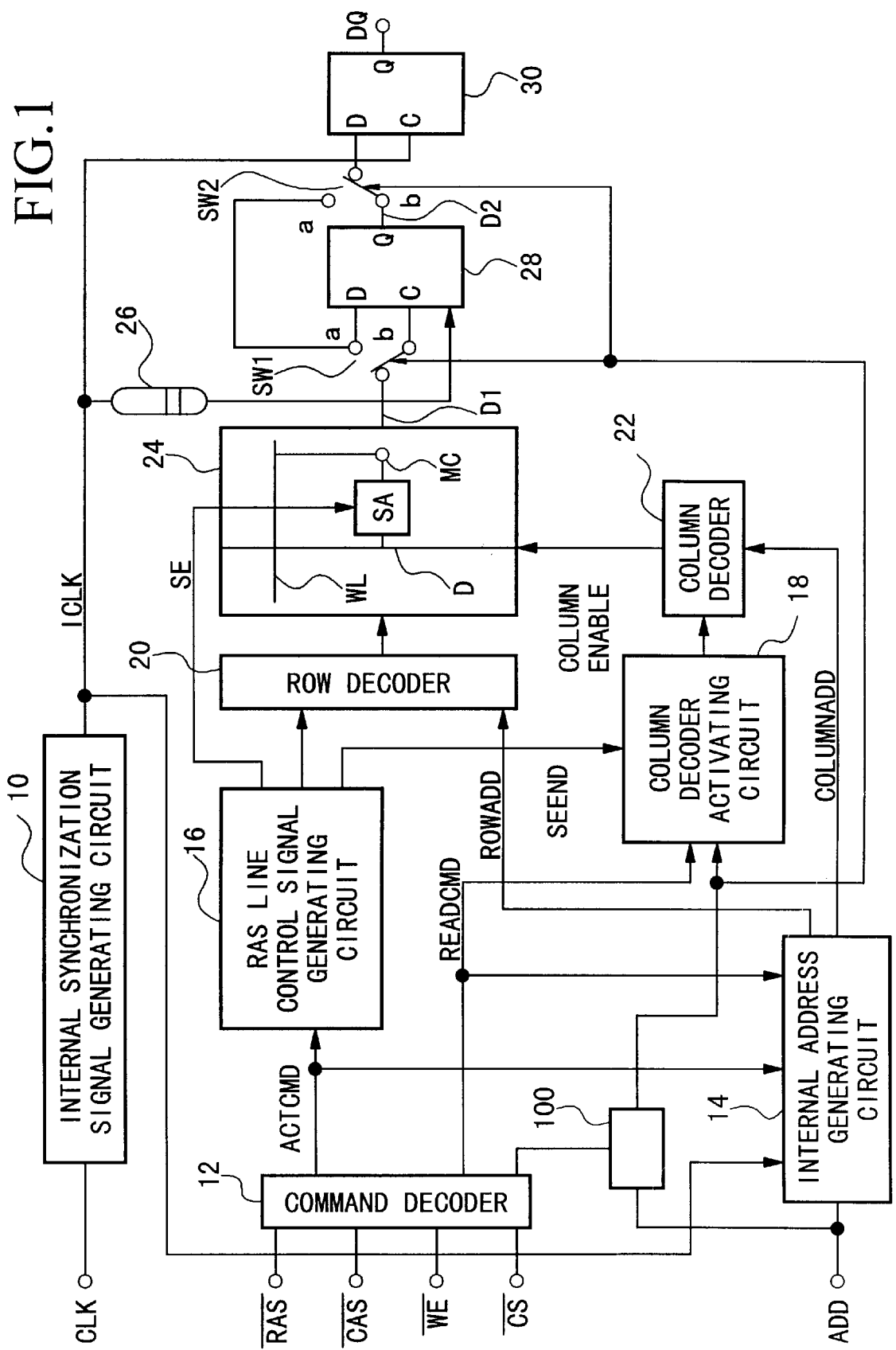
FIG. 1 is a block diagram showing the general structure of the semiconductor memory device as the first embodiment of the present invention.
Figure 3:
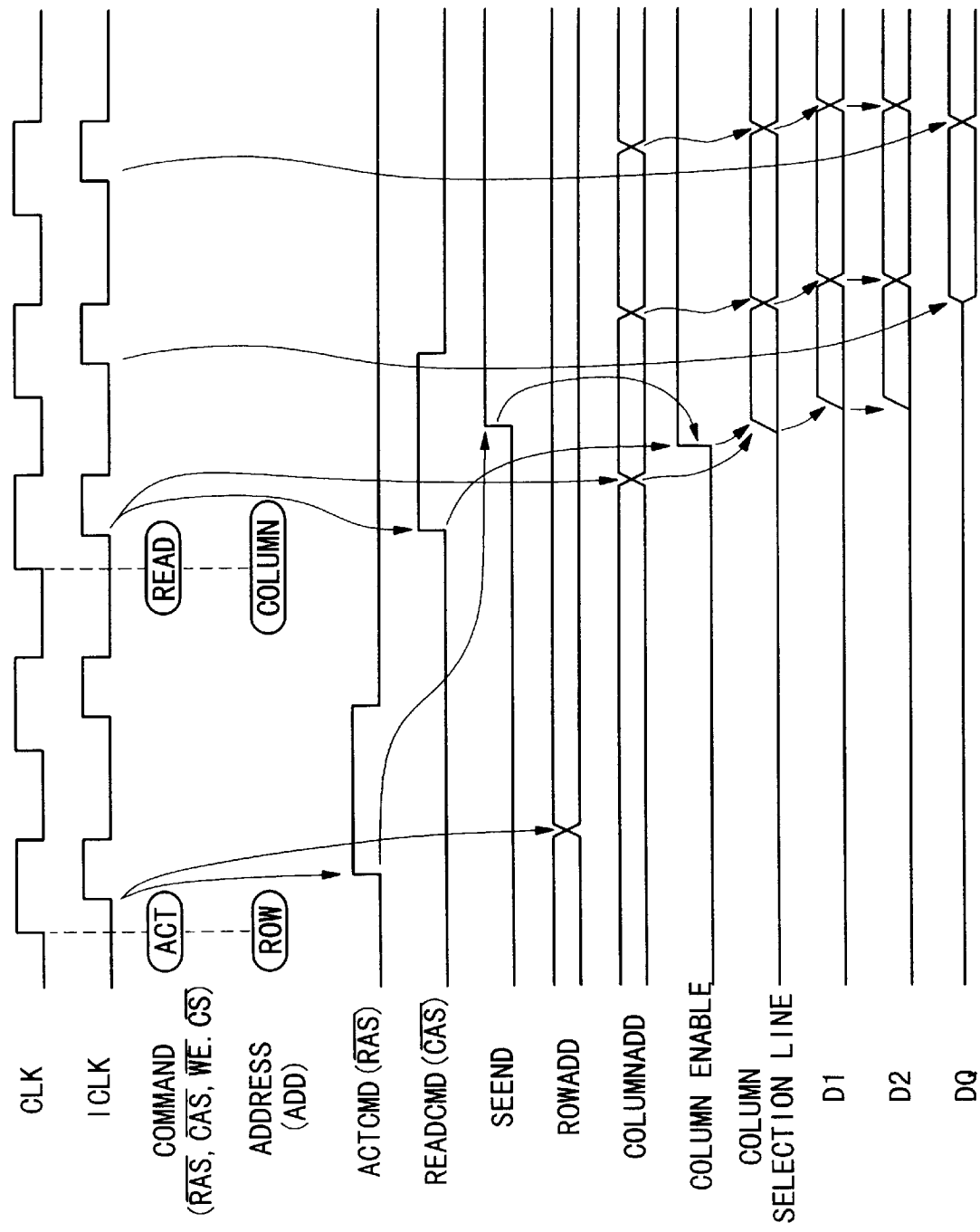
FIG. 3 is a timing chart showing an operation example of the column decoder activating circuit in the semiconductor memory device of FIG. 1.
Figure 4:
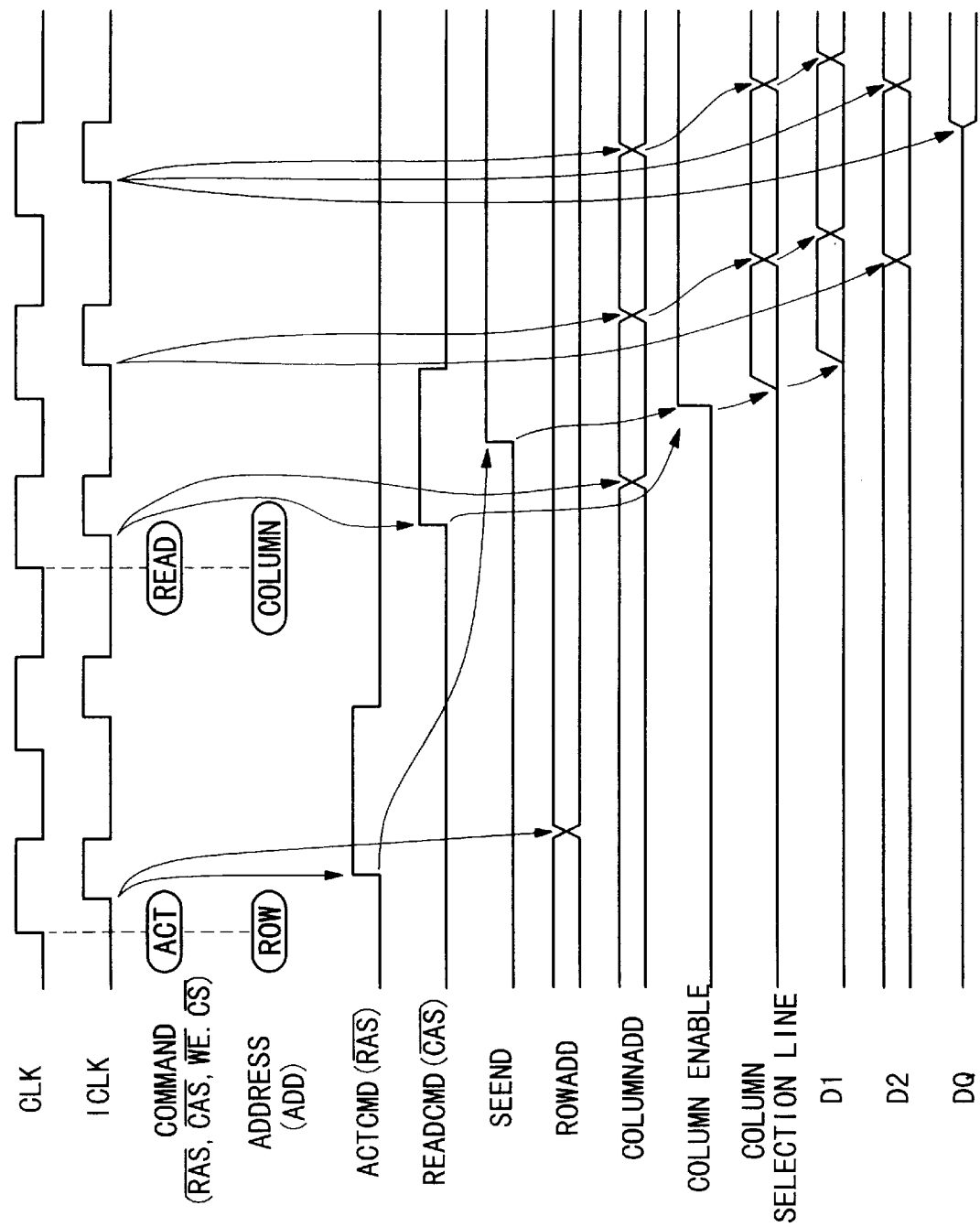
FIG. 4 is a timing chart showing an operation example of the column decoder activating circuit in the semiconductor memory device of FIG. 1.

FIG. 1 is a block diagram showing the general structure of the semiconductor memory device of the first embodiment according to the present invention. FIGS. 3 and 4 are timing charts showing the operation of each part. FIG. 3 shows the operation when the index CLT=2, while FIG. 3 shows the operation when the index CLT=3. Here, the index CLT indicates the CAS access time by using the number of clock pulses output during the period from the time when the column address is confirmed, to the time when data is output from data terminal DQ.

In the present embodiment, when the data is read out, the output timing of the operation enabling signal is determined according to a determination of whether a sufficient RAS access time is obtained, where the RAS access time is the period from the falling time of the RAS, a control signal for determining the timing of confirming the row address data, to the time when the data is output from the target memory cell.

The semiconductor memory device shown in FIG. 1 comprises internal synchronization signal generating circuit 10 for receiving reference clock CLK, generating internal clock ICLK, and outputting the generated signal to relevant structural elements connected thereto, command decoder 12, internal address generating circuit 14, RAS line control signal generating circuit 16, column decoder activating circuit 18, row decoder 20, column decoder 22, memory cell array 24, delay element 26, data flip-flop circuits 28 and 30, switches SW1 and SW2, and CLT setting circuit 100.

The data flip-flop circuits 28 and 30 are provided for controlling the data output timing according to the CLT (=2 or 3). The above internal clock ICLK is supplied via delay element 26 to the clock terminal C of the data flip-flop circuit 28, and is directly supplied to the clock terminal C of the data flip-flop circuit 30.

The CLT setting circuit 100 receives command data output from the command decoder 12 and address signal ADD supplied from an external device, and outputs a control signal based on the current CLT to the column decoder activating circuit 18 and switches SW1 and SW2. The connection states of these switches SW1 and SW2 are determined according to the above control signal.

If the a-contact (see contact "a" of FIG. 1) is selected in both switches SW1 and SW2 by the CLT setting circuit 100, then CLT=2, that is, two pulses of the internal clock ICLK are output from the time when the column address is confirmed to the time when data is output from data terminal DQ. While if b-contact (see contact "b" of FIG. 1) is selected in both switches SW1 and SW2 by the CLT setting circuit 100, then CLT=3, that is, three pulses of the internal clock ICLK are output before data is output from data terminal DQ. Here, the column decoder activating circuit 18 corresponds to the column decoder control section of the present invention.

Figure 2:
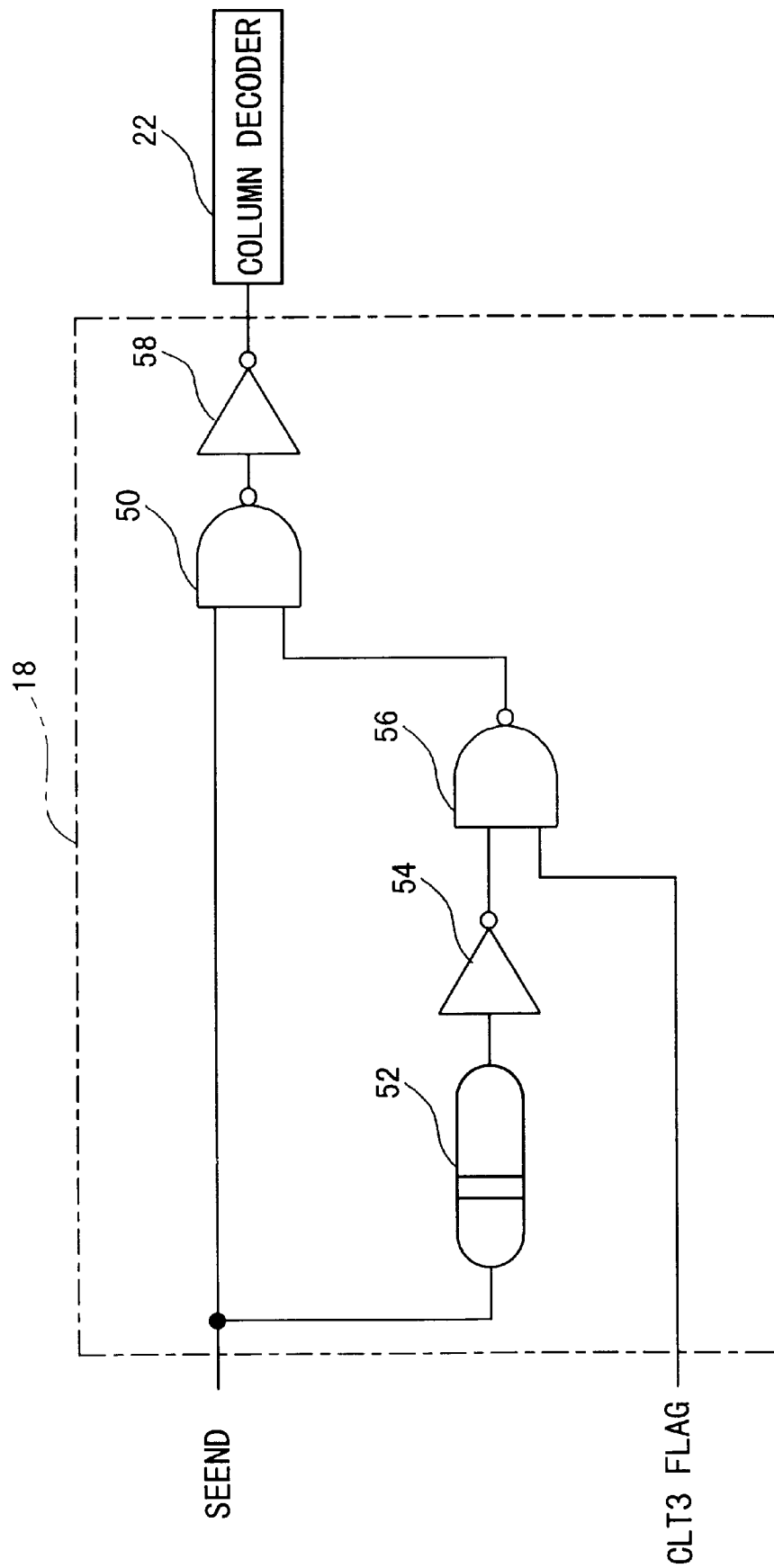
FIG. 2 is a circuit diagram showing the internal structure of the column decoder activating circuit in the semiconductor memory device of FIG. 1.

Below, the structure of the column decoder activating circuit 18 is shown in FIG. 2. In FIG. 2, the column decoder activating circuit 18 comprises delay element 52 for delaying the sense amplifier operation complete signal SEEND by a predetermined time, inverter 54 for inverting the output from the delay element 52, NAND gate 56 for calculating and outputting the negative AND between the output from inverter 54 and a CLT3 flag which indicates that a sufficient RAS access time is obtained, NAND gate 50 for calculating and outputting the negative AND between the sense amplifier operation complete signal SEEND and the output from the NAND gate 56, and inverter 58 for inverting the output from the NAND gate 50 and outputting the inverted signal to the column decoder 22.

The inverter 54 and NAND gate 56 correspond to the first logical product calculating section of the present invention, while the NAND gate 50 and inverter 58 correspond to the second logical product calculating section of the present invention.

The inverter 54 and NAND gate 56 as the first logical product calculating section outputs the delayed signal (obtained by delaying the sense amplifier operation complete signal by a predetermined time) when the CLT3 flag is input.

That is, while the CLT3 flag is reset (i.e., CLT=2), the sense amplifier operation complete signal SEEND is directly output via NAND gate 50 and inverter 58 to the column decoder 22. In contrast, while the CLT3 flag is set, the sense amplifier operation complete signal SEEND is delayed via delay element 52 by a predetermined time, and then output via inverter 58 to the column decoder 22.

Again referring to FIG. 1, the command decoder 12 receives synchronization clock signals RAS, CAS, WE, and CS, and generates and outputs commands such as read command READCMD and active command ACTCMD to relevant sections. The active command ACTCMD corresponds to the synchronization clock signal RAS, and the read command READCMD corresponds to the synchronization clock signal CAS.

The internal address generating circuit 14 converts the address signal (input from an external device into the address terminal) into the row address data and column address data, and respectively outputs these data to row decoder 20 and column decoder 22.

The RAS line control signal generating circuit 16 generates and outputs control signals such as the sense enable signal SE for making the sense amplifier operable and the sense amplifier operation complete signal SEEND for indicating the completion timing of the operation of the sense amplifier, based on the output timing of the synchronization clock signal RAS.

The row address is decoded by row decoder 20 and relevant word line WL is selected, and data is read out to data line D via sense amplifier SA from the target memory cell MC connected to the word line WL.

The column decoder activating circuit 18 receives the sense amplifier operation complete signal SEEND from the RAS line control signal generating circuit 16, and also receives the read command READCMD (corresponding to CAS) from the command decoder 12, and outputs based on these received signals an operation enabling signal COLUMN ENABLE for making the column decoder 22 operable to the column decoder. As described above, while the CLT3 flag is reset, that is, CLT=2, the sense amplifier operation complete signal SEEND is directly output as the operation enabling signal COLUMN ENABLE, and while the CLT3 flag is set, the signal obtained by delaying the sense amplifier operation complete signal SEEND is output.

As a result, the column decoder 22 is made operable, and the column address data COLUMN ADD received from the internal address generating circuit 14 is decoded, and the data line to which the target memory cell (for data read) is connected is selected. As for data appearing on the data lines, only data on the data line selected by the column decoder 22 is effective, and the effective data is output as output D1 of memory cell array 24. When CLT=2, the a-contact is selected in the switches SW1 and SW2; thus, the data output to data line D1 is input into data input terminal D of the data flip-flop circuit 30 not via the data flip-flop circuit 28. Therefore, the data is supplied to the output terminal DQ of the data flip-flop circuit 30 after the column address is determined and then two pulses of the internal clock signal ICLK are output (refer to FIG. 3).

When CLT=3, the b-contact is selected in the switches SW1 and SW2, and the data output to output line D1 is then output via the data flip-flop circuits 28 and 30 to data terminal DQ. Therefore, the data is supplied to the output terminal DQ after the column address is determined and then three pulses of the internal clock signal ICLK are output (refer to FIG. 4).

As explained above, in the present embodiment, when the data is read out, the column decoder activating circuit determines the output timing of the operation enabling signal based on the sense amplifier operation complete signal which indicates the completion of the amplifying operation of the sense amplifier and the identification signal which indicates whether a sufficient RAS access time is obtained. In this process, if a sufficient RAS access time is not obtained, the output timing of the sense amplifier operation complete signal is employed as the output timing of the operation enabling signal, while if a sufficient RAS access time is obtained, the output timing of the sense amplifier operation complete signal is delayed by a predetermined time, and the delayed timing is employed as the output timing of the operation enabling signal. Accordingly, when a sufficient RAS access time can be obtained, the column decoder can be made operable with a sufficient margin with respect to the output timing of the sense amplifier operation complete signal. In contrast, when a sufficient RAS access time cannot be obtained, that is, when it is desirable to operate the column decoder with a high speed, the column decoder can be made operable when the sense amplifier operation complete signal is output.

Figure 5:
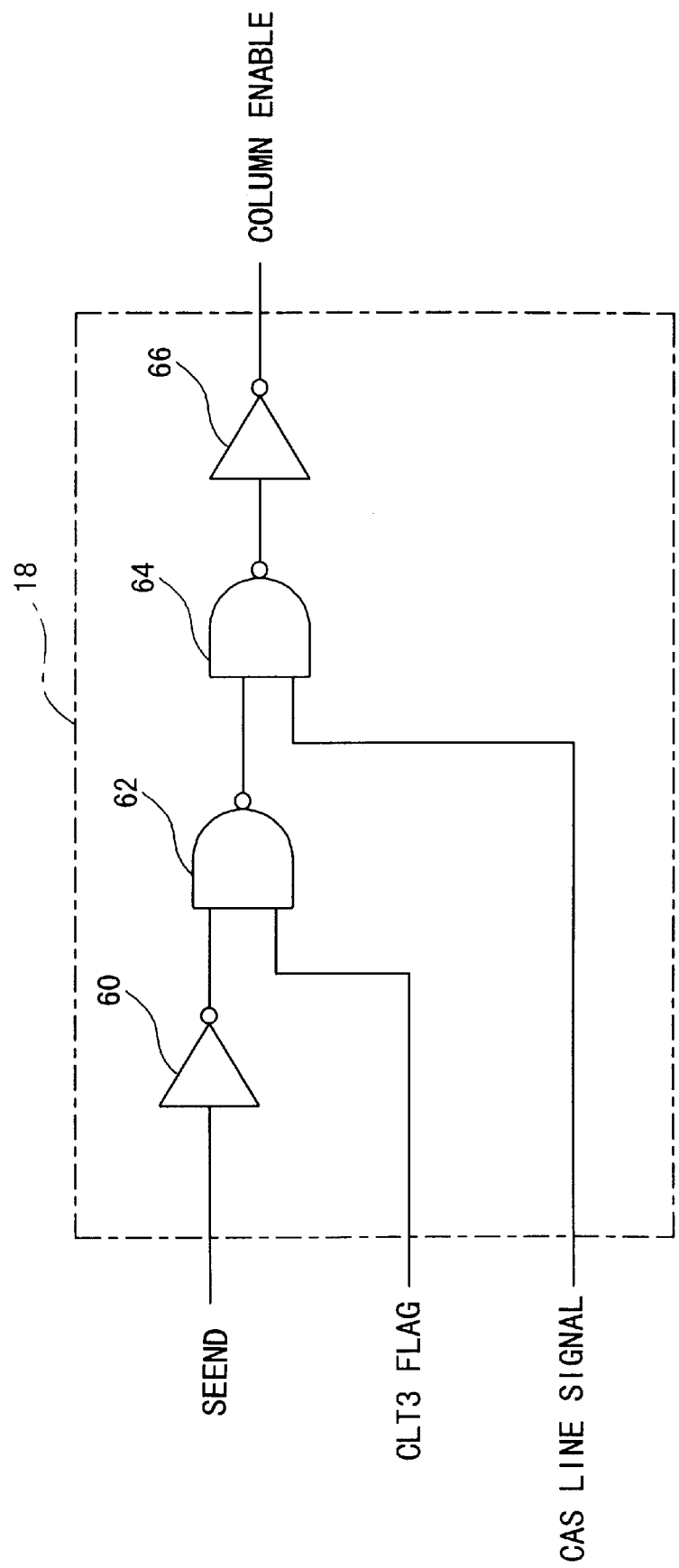
FIG. 5 is a circuit diagram showing the internal structure of the column decoder activating circuit in the semiconductor memory device as the second embodiment of the present invention.

Below, the semiconductor memory device of the second embodiment according to the present invention will be explained. The structural difference of the present embodiment in comparison with the first embodiment is the internal structure of the column decoder activating circuit 18. The other structural elements are the same as those in the first embodiment, and explanations thereof are omitted. FIG. 5 shows the internal structure of the column decoder activating circuit 18 of the second embodiment.

In the present embodiment, when the data is read out, the column decoder control section determines whether the operation enabling signal is output after the sense amplifier operation complete signal is output, according to the RAS access time.

In FIG. 5, column decoder activating circuit 18 comprises inverter 60 for inverting the sense amplifier operation complete signal SEEND, NAND gate 62 for calculating and outputting the negative AND between the output from the inverter 60 and the CLT3 flag which indicates that a sufficient RAS access time is obtained, NAND gate 64 for calculating and outputting the negative AND between the output from the NAND gate 62 and a CAS line signal which is the CAS (control signal) for confirming the column address or a signal equivalent to the CAS, and inverter 66 for inverting the output of NAND gate 64.

The inverter 60 and NAND gate 62 correspond to the first logical product calculating section of the present invention, while the NAND gate 64 and inverter 66 correspond to the second logical product calculating section of the present invention.

When no identification signal is input into the NAND gate 62 (a constituent of the first logical product calculating section), that is, while the CLT3 flag is reset, the level of one of the input terminals of NAND gate 64 (a constituent of the second logical product calculating section) is fixed to High using the output from the NAND gate 62; thus, the CAS (control signal) or a signal equivalent thereto is output from the inverter 66 as the operation enabling signal COLUMN ENABLE for making the column decoder 22 operable.

On the other hand, when the identification signal is input and while the CLT3 flag is set, the sense amplifier operation complete signal SEEND from NAND gate 62 is directly input into one of the input terminals of NAND gate 64; thus, in this case, a signal based on the result of the NAND operation between the sense amplifier operation complete signal SEEND and the CAS (control signal) or a signal equivalent thereto is supplied to the column decoder 22 as the operation enabling signal COLUMN ENABLE.

That is, when a sufficient RAS access time can be obtained (i.e., while the CLT3 flag is set), the column decoder can be made operable after the sense amplifier operation complete signal is output. In contrast, when a sufficient RAS access time cannot be obtained, the column decoder can be made operable before the sense amplifier operation complete signal is output, for example, when the CAS or a signal equivalent thereto is output.

Below, the semiconductor memory device of the third embodiment according to the present invention will be explained. The structural difference of the present embodiment in comparison with the first and second embodiments is to provide a timing adjusting section for determining (according to the RAS access time) the input timing of the column address data supplied to the column decoder. This timing adjusting section is provided instead of the column decoder activating circuit 18, and other structural elements of the third embodiment are equal to those in the first embodiment, and explanations thereof are omitted here.

Figure 6:
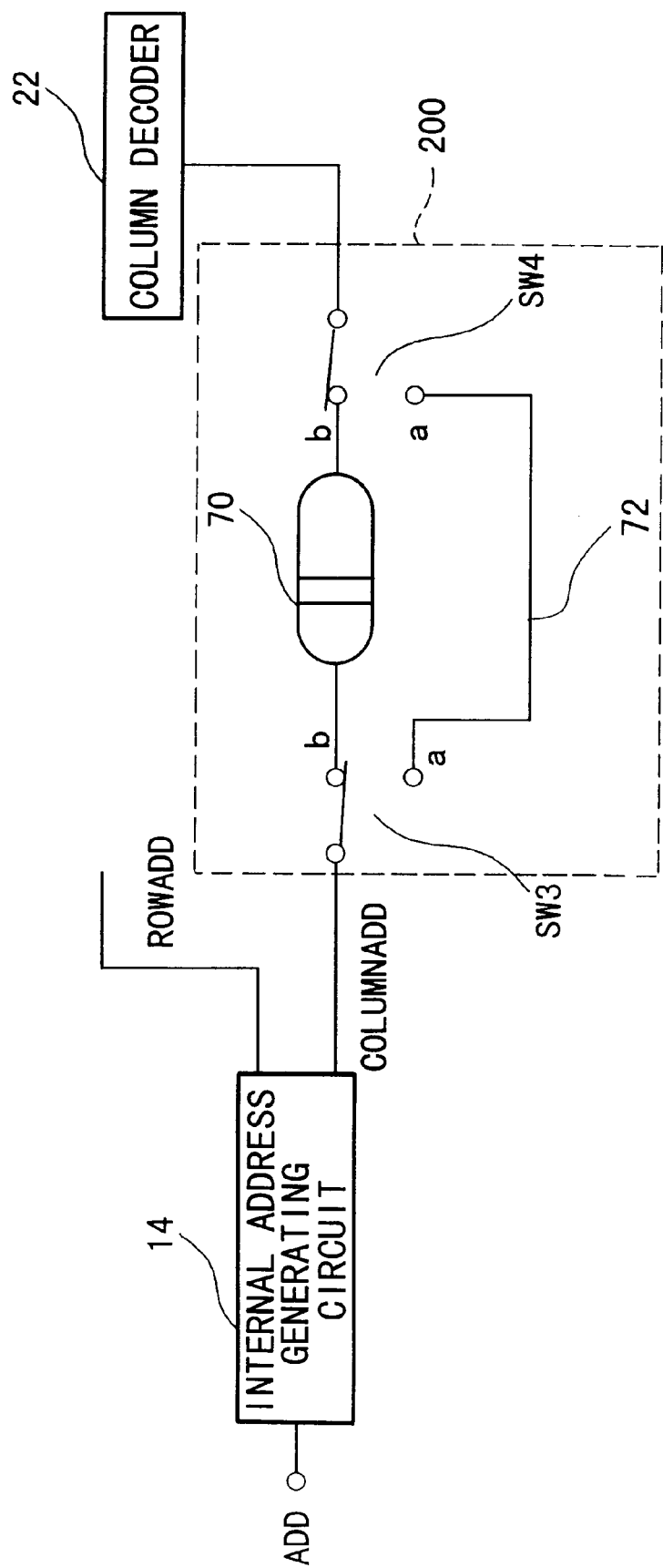
FIG. 6 is a circuit diagram showing the distinctive structural part of the semiconductor memory device as the third embodiment of the present invention.
Figure 7:
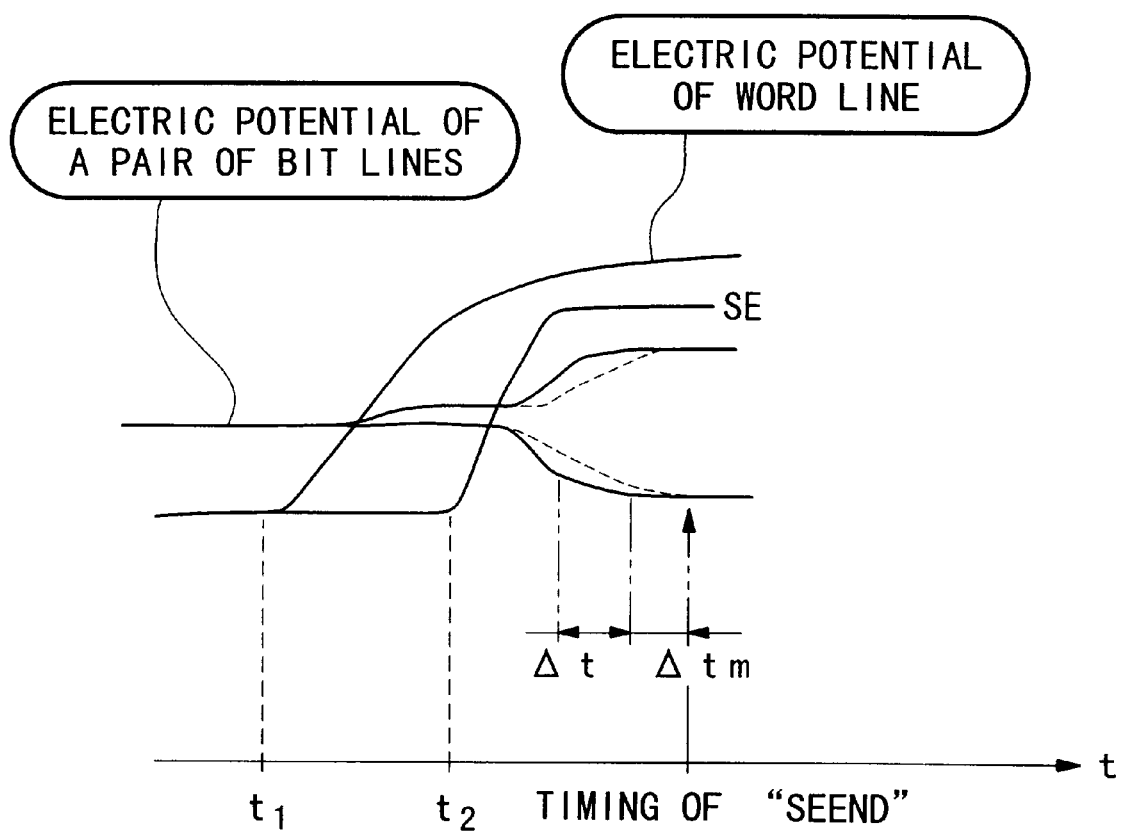
FIG. 7 is a timing chart showing the operation of a conventional semiconductor memory device.
Figure 8:
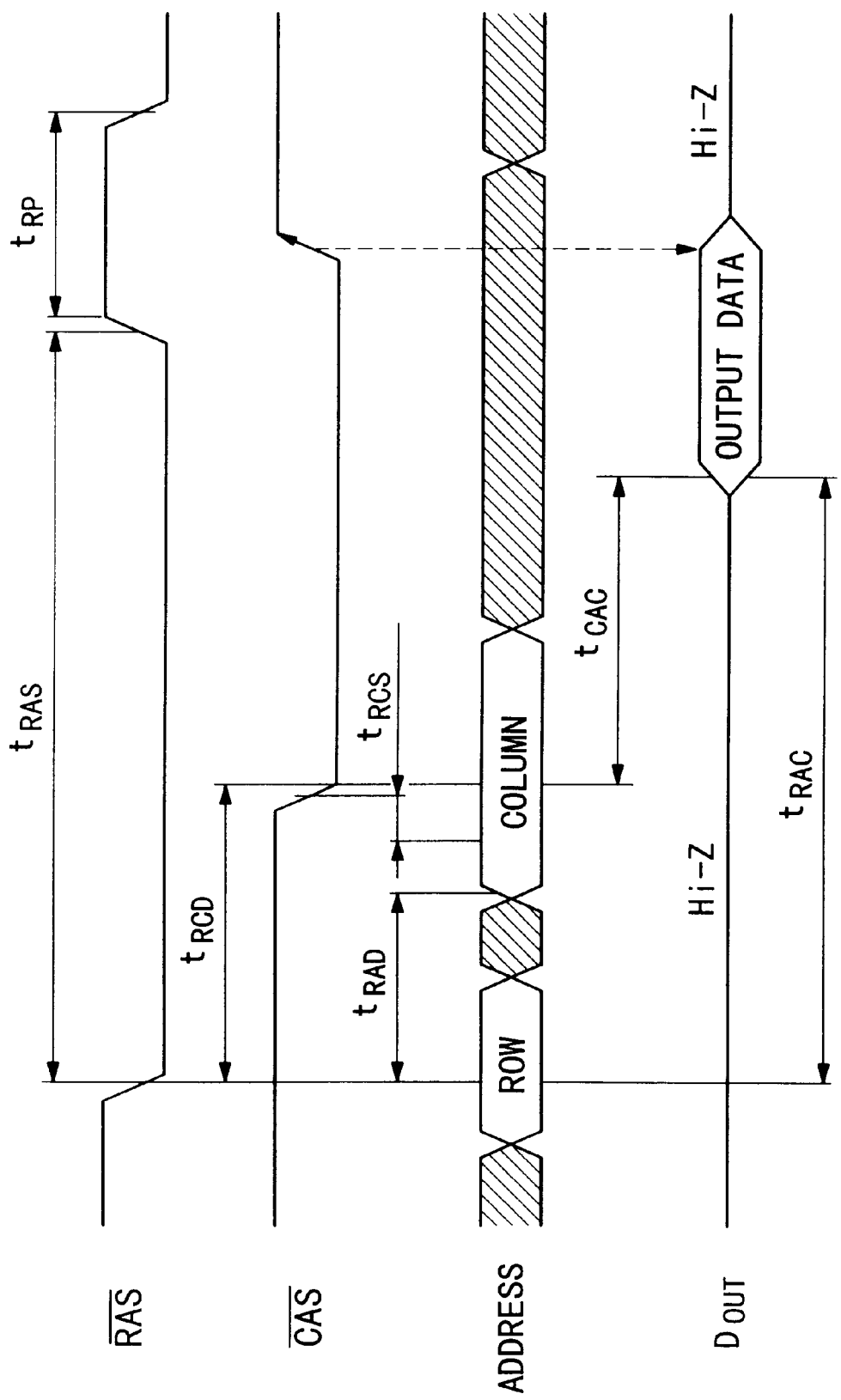
FIG. 8 is a timing chart showing the data-read operation of the semiconductor memory device.

The structure of the distinctive portion of the semiconductor memory device of the third embodiment according to the present invention is shown in FIG. 6. In the figure, the timing adjusting section 200 comprises delay element 70 (corresponding to the delay circuit of the present invention) for delaying the input timing of the column address data sent from the internal address generating circuit 14 to column decoder 22, signal transmission line 72 for transmitting the column address data with no delay, and switches SW3 and SW4 (corresponding to the switching section of the present invention) for selectively inputting the column address data via delay element 70 or the signal transmission line 72 to the column decoder 22, according to the RAS access time.

In the above structure, while the CLT3 flag is reset, the a-contact is selected in both switches SW3 and SW4 so that the column address data is directly input from the internal address generating circuit 14 to the column decoder 22. In contrast, while the CLT3 flag is set, the b-contact is selected in both the switches so that the column address data is delayed by the delay element 70 and then supplied to the column decoder 22.

Accordingly, by using the above timing adjusting section, the timing for making the column decoder operable can be suitably determined according to the RAS access time.

What is claimed is:

1. A semiconductor memory device comprising:
    a memory cell array including a plurality of memory cells, each memory cell being connected to a word line and a data line so as to write or read data;
    a row decoder for decoding row address data for designating a word line so as to write or read data to or from a target memory cell, connected to the designated word line, in the memory cell array;

a column decoder for decoding column address data for designating a data line so as to select the data line to which the target memory cell is connected;

a sense amplifier for amplifying a signal which transmits the data read out from the target memory cell; and a column decoder control section for outputting an operation enabling signal for making the column decoder operable to the column decoder, and wherein when the data is read out, the column decoder control section determines the output timing of the operation enabling signal according to a determination of whether a sufficient RAS (row address strobe) access time is obtained, where the RAS access time is the period from the falling time of the RAS, a control signal for determining the timing of confirming the row address data, to the time when the data is output from the target memory cell.

2. A semiconductor memory device as claimed in claim 1, wherein when the data is read out, the column decoder control section determines said output timing based on at least a sense amplifier operation complete signal which indicates the completion of the amplifying operation of the sense amplifier and an identification signal which indicates that a sufficient RAS access time is obtained, in a manner such that:

if a sufficient RAS access time is not obtained, the output timing of the sense amplifier operation complete signal is employed as the output timing of the operation enabling signal, while if a sufficient RAS access time is obtained, the output timing of the sense amplifier operation complete signal is delayed by a predetermined time, and the delayed timing is employed as the output timing of the operation enabling signal.

3. A semiconductor memory device as claimed in claim 2, wherein the column decoder control section comprises:

a first logical product calculating section for calculating and outputting a logical product between a signal obtained by delaying the sense amplifier operation complete signal by a predetermined time and the identification signal; and a second logical product calculating section for calculating and outputting a logical product between the sense amplifier operation complete signal and the output from the first logical product calculating section, and wherein when the identification signal is input into the first logical product calculating section, the second logical product calculating section outputs the sense amplifier operation complete signal delayed by the predetermined time.

4. A semiconductor memory device comprising:

a memory cell array including a plurality of memory cells, each memory cell being connected to a word line and a data line so as to write or read data;

a row decoder for decoding row address data for designating a word line so as to write or read data to or from a target memory cell, connected to the designated word line, in the memory cell array;

a column decoder for decoding column address data for designating a data line so as to select the data line to which the target memory cell is connected;

a sense amplifier for amplifying a signal which transmits the data read out from the target memory cell; and a column decoder control section for outputting an operation enabling signal for making the column decoder operable to the column decoder, and wherein when the data is read out, the column decoder control section determines whether the operation enabling signal is output after a sense amplifier operation complete signal which indicates the completion of the amplifying operation of the sense amplifier is output, according to a RAS (row address strobe) access time which is the period from the falling time of the RAS, a control signal for determining the timing of conforming the row address data, to the time when the data is output from the target memory cell.

5. A semiconductor memory device as claimed in claim 4, wherein the column decoder control section comprises:

a first logical product calculating section for calculating and outputting a logical product between the sense amplifier operation complete signal and an identification signal which indicates that a sufficient RAS access time is obtained; and a second logical product calculating section for calculating and outputting a logical product between the output from the first logical product calculating section and the CAS (column address strobe) which is a control signal for confirming the row address data or a signal equivalent to the CAS, and wherein while the identification signal is not input into the first logical product calculating section, the second logical product calculating section outputs the CAS or the signal equivalent to the CAS as the operation enabling signal; and when the identification signal is input into the first logical product calculating section, the second logical product calculating section outputs a signal corresponding to the logical product between the sense amplifier operation complete signal and the CAS or the signal equivalent to the CAS, as the operation enabling signal.

6. A semiconductor memory device comprising:

a memory cell array including a plurality of memory cells, each memory cell being connected to a word line and a data line so as to write or read data;

a row decoder for decoding row address data for designating a word line so as to write or read data to or from a target memory cell, connected to the designated word line, in the memory cell array;

a column decoder for decoding column address data for designating a data line so as to select the data line to which the target memory cell is connected;

a sense amplifier for amplifying a signal which transmits the data read out from the target memory cell; and a timing adjusting section for determining the input timing of the column address data supplied to the column decoder, according to a RAS (row address strobe) access time which is the period from the falling time of the RAS, a control signal for determining the timing of confirming the row address data, to the time when the data is output from the target memory cell.

7. A semiconductor memory device as claimed in claim 6, wherein the timing adjusting section comprises:

a delay circuit for delaying the input timing of the column address data;

a signal transmission line for directly transmitting the column address data; and a switching section for selectively inputting the column address data via the delay circuit or the signal transmission line into the column decoder, according to the RAS access time.

* * * * *